United States Patent
Lee et al.

(10) Patent No.: US 8,338,262 B2
(45) Date of Patent: Dec. 25, 2012

(54) DUAL WAVELENGTH EXPOSURE METHOD AND SYSTEM FOR SEMICONDUCTOR DEVICE MANUFACTURING

(75) Inventors: Heng-Jen Lee, Baoshan Township, Hsinchu County (TW); Jui-Chun Peng, Hsin-Chu (TW); I-Hsiung Huang, Hukou Shiang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 530 days.

(21) Appl. No.: 12/478,426

(22) Filed: Jun. 4, 2009

(65) Prior Publication Data
US 2010/0308439 A1  Dec. 9, 2010

(51) Int. Cl.
*H01L 21/336*  (2006.01)
(52) U.S. Cl. ......... 438/308; 438/378; 438/795; 257/618
(58) Field of Classification Search .................. 257/618; 438/308, 378, 795
See application file for complete search history.

(56) References Cited

U.S. PATENT DOCUMENTS

| | | | |
|---|---|---|---|
| 2001/0023050 A1* | 9/2001 | Numata et al. | 430/270.1 |
| 2003/0108818 A1* | 6/2003 | Livesay et al. | 430/296 |
| 2004/0032031 A1* | 2/2004 | Holscher et al. | 257/797 |

OTHER PUBLICATIONS

Vanderhart, D.L., et al., Proton NMR Determination of Miscibility in a Bulk Model Photoresist System: Poly (4-hydroxystyrene) and the Photoacid Generator, Di (tert-butylphenyl) Iodonium Perfluorooctanesulfonate. Polymers Division, National Institute of Standards and Technology, Gaithersburg, MD 20899. Publisher: Chem. Matter. Jul. 13, 2004, vol. 16, pp. 3074-3084. U.S.
Wikipedia. On-line encyclopedia article re: Photoresist. http:/en.wikipedia.org/wiki/Photoresist, Feb. 27, 2009. U.S.

* cited by examiner

*Primary Examiner* — Anthony Ho
(74) *Attorney, Agent, or Firm* — Duane Morris LLP

(57) ABSTRACT

A dual wavelength exposure system provides for patterning a resist layer formed on a wafer for forming semiconductor devices, using two exposure operations, one including a first radiation having a first wavelength and the other including a second radiation including a second wavelength. Different or the same lithography tool may be used to generate the first and second radiation. For each die formed on the semiconductor device, a critical portion of the pattern is exposed using a first exposure operation that uses a first radiation with a first wavelength and a non-critical portion of the pattern is exposed using a second exposure operation utilizing the second radiation at a second wavelength. The resist material is chosen to be sensitive to both the first radiation having a first wavelength and the second radiation having the second wavelength.

14 Claims, 2 Drawing Sheets

DUAL WAVELENGTH EXPOSURE METHOD AND SYSTEM FOR SEMICONDUCTOR DEVICE MANUFACTURING

FIELD OF THE INVENTION

The disclosure is related to semiconductor device manufacturing. More particularly, the disclosure is related to a system and method for forming a pattern in a semiconductor device level using a dual wavelength exposure system and method.

BACKGROUND

In today's rapidly advancing semiconductor device manufacturing industry, there is a challenge to continue to increase the size of the wafers used in semiconductor manufacturing while at the same time reducing the dimensions of the device features. In order to reduce the dimensions of device features and spacings, lithography systems that use exposure energies with increasingly lower wavelengths are being utilized because they provide superior pattern resolution. Two examples of such exposure tools used to expose photoresist materials are extreme ultraviolet (EUV) and electron beam direct writing (EDBW) lithography tools. EUV lithography tools utilize extremely short wavelength (typically shorter than about 180 nm) UV radiation and are advantageously used in photolithography to expose ultra-small (below 100 nm) geometries. As opposed to conventional photolithography in which optical lenses are used to direct and shape the light beam, EUV photolithography uses very high precision mirrors for the same purpose. As such, a different mask design is needed for EUV lithography tools. EDBW is distinguished from photolithography as it involves electron beam, i.e. e-beam lithography that uses a focused beam of electrons to expose the resist. No mask is used as a pattern is "written" directly into the resist by scanning of the electron beam. Pattern resolution below 100 nm may be achieved.

The EUV and EDBW lithography tools use extremely low wavelength energy sources with associated high powers to activate the polymers in the photoresist material. The smaller wavelengths allow for an increased resolution to be achieved, such as needed for increased miniaturization of device features and spacings between features, i.e., for smaller critical dimensions. The low wavelength, high power exposure process, however, requires an increase in exposure time and therefore a decrease in throughput of wafers through the exposure operation compared to conventional optical photolithography.

The lower throughput and resulting increase in cycle time is compounded by the increased size of semiconductor wafers now being used in the semiconductor manufacturing industry as the entire surface of the wafer, i.e. each die, must be exposed to the radiation energy. For example, 450 mm wafer sizes are now advantageously being used in the semiconductor manufacturing industry. According to current technologies, when such large wafers are processed through electron beam direct writing exposure systems, the throughput may be less than five wafers per hour. This extremely low throughput level presents a bottleneck in the manufacturing process. Such a low throughput level also increases the cost to manufacture a device because of the increased cycle time and/or the requirement to purchase additional multimillion dollar exposure tools to minimize the impact of the decreased throughput.

It would therefore be desirable to produce semiconductor devices having the requisite feature resolution demanded by current and future technology, with a suitably low cycle time, i.e., it would be desirable to produce semiconductor devices of requisite quality in a faster time.

SUMMARY

To address these and other needs and in view of its purposes, one aspect of the invention provides a method for forming a pattern on a level of a semiconductor device. The method includes providing a wafer with a layer of resist material thereon, forming a pattern in the layer of resist material by exposing a first portion of the pattern using first radiation with a first wavelength being one of 365 nm, 248 nm and 193 nm. The method also provides for exposing a second portion of the same pattern using second radiation with a second wavelength, said second radiation being one of an e-beam and extreme ultraviolet radiation.

An embodiment of the invention provides a semiconductor device comprising a semiconductor wafer having a pattern formed in a layer of a photosensitive material disposed on a surface of the semiconductor wafer. The pattern includes a first portion formed using a first radiation with a first exposure wavelength and a second portion formed using a second radiation with a second exposure wavelength.

Another embodiment of the invention provides a system for forming a pattern on a layer of a semiconductor device. The system comprises a first lithography tool that produces a first portion of a pattern in a layer of resist material, the first lithography tool being one of an i-line exposure system, a 248 nm exposure system and a 193 nm exposure system; and a second lithography tool that produces a second portion of the pattern in the resist material using a second exposure energy, the second lithography tool being one of an electron beam direct writing (EDBW) lithography tool and an extreme ultraviolet (EUV) lithography tool.

BRIEF DESCRIPTION OF THE DRAWINGS

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
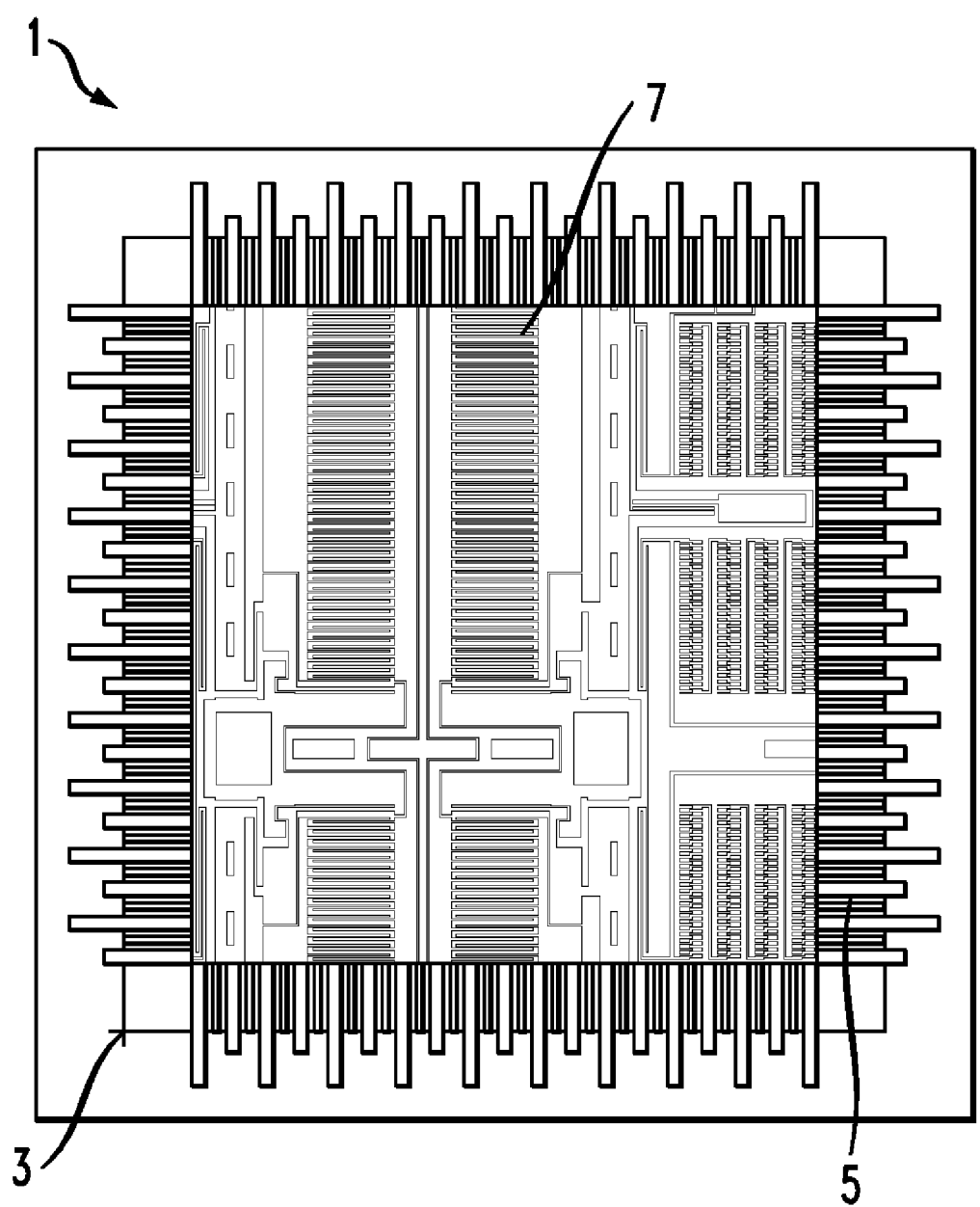
FIG. 1 is a plan view of a pattern formed on a semiconductor device.

FIG. 1 is a plan view of a pattern formed on a die at an exemplary device level in an exemplary semiconductor device. Each semiconductor device is formed on an associated die and a plurality of die that may be hundreds or thousands of die, are simultaneously formed on a single semiconductor substrate commonly referred to in the semiconductor manufacturing industry as a wafer. Exemplary die 1 is illustrated in FIG. 1 and the semiconductor device may be an integrated circuit or other semiconductor device. Die 1 represents just one die on a semiconductor wafer having hundreds or thousands of such die. Die 1 may be an active die, i.e. it may include an active device such as a functional integrated circuit or other active semiconductor device, or die 1 may simply be a test die. The generally square shape of die 1 shown in FIG. 1 is intended to be exemplary only. According to other exemplary embodiments, die 1 may take on other shapes such as rectangular or even other shapes such as hexagonal, trapezoidal or round. The present invention finds application in the patterning of die having various shapes and sizes. Moreover, the invention finds application in producing semiconductor devices having various feature sizes. While aspects of the invention find particular advantage in producing semiconductor devices having very small dimensions, the invention is not so limited and may be used to accurately and precisely form devices of various technologies. The invention provides for patterning die which include small feature sizes, with high device resolution and at a comparatively high throughput level. The invention may be used to form patterns in any of the multiple patterning operations used to produce a semiconductor device.

Die 1 includes device level pattern 3 that includes peripheral portion 5 and central portion 7. Device level pattern 3 is a pattern formed in a layer of resist material and may represent any of the various levels in a semiconductor device being manufactured. For example, device level pattern 3 may be a pattern in a layer of resist material that will be used as an etching mask to translate the pattern from the layer of resist material to an underlying material layer. Device level pattern 3 may also represent a pattern formed in a layer of resist material that will be used as an implantation mask. Device level pattern 3 may, in essence, represent any pattern formed, by exposure, in a resist material at any layer of any semiconductor device including active devices and test structures formed on test die.

Peripheral portion 5 of device level pattern 3, may generally include device features and spacings between the features that are of larger dimension than the features and spacings in central portion 7. According to various exemplary embodiments, central portion 7 may include the logic circuitry and the critical dimension features for the particular device level. Peripheral portion 5 may, according to various exemplary embodiments, include the I/O, input/output, circuitry including bond pads and larger dimension bus lines. As such, according to the exemplary embodiment, central portion 7 may be considered to be the critical portion of the pattern and peripheral portion 5 may be considered to be the non-critical portion of the pattern. According to other exemplary embodiments, the critical and non-critical portions may take on other arrangements than the illustrated central and peripheral portions. According to other exemplary embodiments, there may be a plurality of critical portions disposed centrally or peripherally with respect to die 1. According to other exemplary embodiments, the non-critical portions may include one or more peripheral portions as well as one or more centrally disposed non-critical portions. The spatial arrangement of the critical portion and the non-critical portion may vary in other exemplary embodiments.

According to an aspect of the invention, for each die 1, device level pattern 3 is formed by coating a layer of photoresist or other resist material on a wafer then separately exposing the non-critical and critical portions, i.e. separately exposing peripheral portion 5 and central portion 7. After exposing each pattern portion to radiation using a photomask or direct writing means as will be described infra, a single pattern exists on each die, as device level pattern 3. After exposure to radiation, each pattern consists of and is defined by exposed features and unexposed features in the resist. According to an exemplary embodiment in which positive resist is used, the exposed portion of the pattern will be developed to remove the exposed features in the pattern. In positive resist materials, the exposure causes the generation of acids in the resist which are developed away by the developer. Conventional means may be used for developing and the developing process simultaneously develops the exposed features of both central portion 7 and peripheral portion 5. The developed pattern may then be used as an etching mask, an ion implantation mask, or for various other purposes.

Peripheral portion 5 and central portion 7 are exposed in separate operations but combine to form one pattern, device level pattern 3. Peripheral portion 5 is exposed by a first radiation having a first wavelength and central portion 7 is exposed by a second radiation having a second wavelength. According to one exemplary embodiment, separate lithography tools may be used to expose peripheral portion 5 to the first radiation with the first wavelength and central portion 7 to the second radiation with the second wavelength. According to another exemplary embodiment, a single exposure apparatus may be capable of generating radiation having different wavelengths and may be used to produce both the first and second radiation, in separate exposure operations. According to the embodiment in which separate lithography tools are used, the first exposure tool exposes the non-critical peripheral portion 5 of each die of a semiconductor wafer, with first radiation at the first wavelength, and the second exposure tool exposes the critical central portion 7 of each die of the semiconductor wafer, with the second radiation at the second wavelength.

Figure 2A:
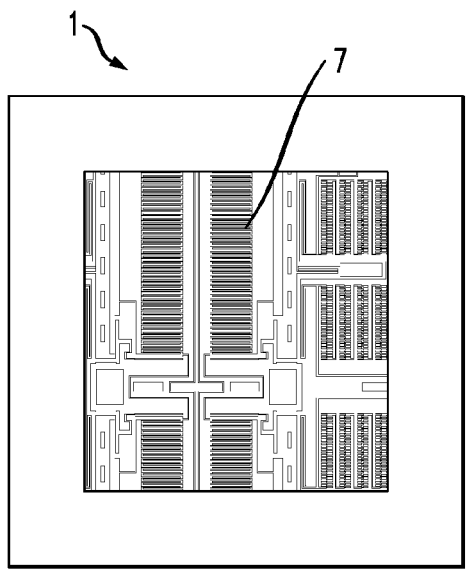
FIGS. 2A and 2B separately illustrate components of the pattern shown in FIG. 1.
Figure 2B:
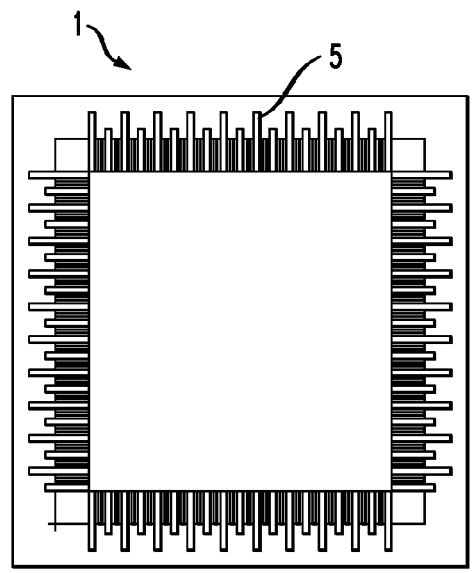

FIGS. 2A and 2B show more clearly the respective portions of device level pattern 3, i.e. central portion 7 in FIG. 2A and peripheral portion 5 of FIG. 2B. Central portion 7 but not peripheral portion 5 is exposed in one exposure operation and peripheral portion 5 but not central portion 7 is exposed in another exposure operation.

Figure 3:
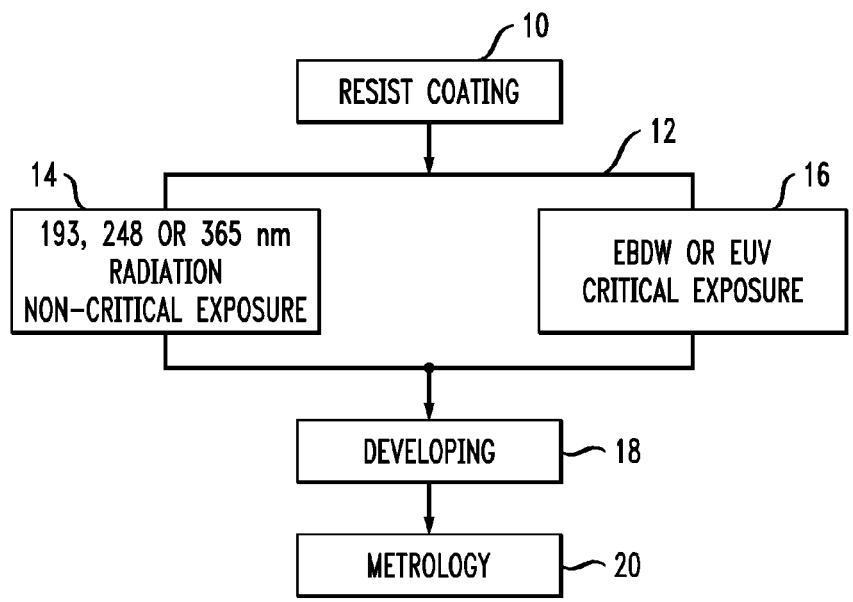
FIG. 3 is a flow chart showing an exemplary method according to the invention.

FIG. 3 is a flow chart illustrating an exemplary sequence of events for carrying out an exemplary embodiment of the invention. Resist coating takes place at step 10 which includes providing a semiconductor substrate, i.e., wafer, and coating the wafer with a layer of photoresist or other resist according to the embodiment in which EBDW will be used to expose the critical portion of the pattern. Various types of wafers may be used, variously sized wafers may be used, and various conventional techniques are available for coating the wafer with resist. Various resist thicknesses may be used. The resist layer will then have formed therein a pattern for each of a plurality of die that are being formed on the wafer. The die may include active semiconductor device die and test die which include different patterns than the active semiconductor device die. Each pattern is a singular cohesive pattern formed for each die even though portions of the pattern associated with each die are formed using different exposure operations. The singular cohesive pattern associated with a particular die at a particular device level represents the totality of structures/features required at the particular device level, though the pattern may include discrete sections such as test structures that may be electrically isolated from active circuitry.

The resist material is chosen in conjunction with the exposure radiation and associated wavelengths, and the exposure systems that will be used to form the respective portions of device level pattern 3, i.e., peripheral portion 5 and central portion 7. Exposure operation 12 includes both non-critical exposure 14 and critical exposure 16, carried out as separate exposure operations. Non critical exposure 14 may include exposure radiation having a wavelength of 365 nm referred to as i-line exposure, 248 nm or 193 nm, whereas critical portion exposure 16 involves EDBW or EUV exposure.

The resist material is chosen to be lithographically sensitive to both radiation used to expose peripheral portion 5 during non-critical exposure 14 and radiation used to expose central portion 7 during critical exposure 16.

According to an application in which non-critical exposure 14 includes exposure radiation having a wavelength of 193 nm, the resist material may include a methacrylate material. The methacrylate component will cause acid generation in the exposed resist material in response to exposure by both 193 nm radiation and EUV and EDBW radiation energy. In other exemplary embodiments, resist materials using other polycyclic polymers may be used in this application.

According to an application in which non-critical exposure 14 includes exposure radiation having a wavelength of 248 nm, the resist material may include poly hydroxyl styrene (PHS). The poly hydroxyl styrene component will cause acid generation in the exposed photoresist material in response to exposure by both 248 nm radiation and EUV and EDBW radiation energy. In other exemplary embodiments, resist materials containing other suitable, lithographically sensitive aromatic compounds may be used for this application.

According to an application in which non-critical exposure 14 includes exposure radiation having a wavelength of 365 nm, the resist material may include a Novolak resin. The Novolak resin will cause acid generation in the exposed resist material in response to exposure by both 365 nm radiation and EUV and EDBW radiation energy. In other exemplary embodiments, resist materials containing other suitable, lithographically sensitive aromatic compounds may be used for this application.

Various conventional optical lithography tools may be used to produce light radiation having wavelengths of 365 nm, 248 nm or 193 nm. These optical lithography tools are advantageously used in conjunction with a photomask to expose the non-critical portions, i.e. peripheral portion 5 of device level pattern 3 in the illustrated embodiment. Non-critical exposure 14 involves the exposure of the non-critical portion of each die throughout the wafer. During critical exposure 16, the critical portion of device level pattern 3, i.e. central portion 7 of each die of the wafer, is exposed. According to one exemplary embodiment, critical portion exposure 16 may be carried out using an electron beam direct writing tool, such tool not requiring a photomask as the pattern is written directly into the resist material using a focused electron beam. According to other exemplary embodiments, critical portion exposure 16 may be carried out using an EUV scanner as are commercially available. Extreme UV light may include a wavelength of about 13.5 nm according to one exemplary embodiment, and the EUV scanner may use the same or a different photomask as was used in non-critical exposure 14, to form the pattern.

According to one exemplary embodiment, non-critical exposure 14 may take place prior to critical exposure 16 for a particular wafer and according to another exemplary embodiment, non-critical exposure 14 may take place subsequent to critical exposure 16 for a particular wafer. As such, when a group of production wafers such as a production lot of wafers, is being run through exposure operation 12, simultaneous exposure processing may occur as some wafers may first be exposed in the non-critical exposure 14 while at the same time other wafers of the lot are being first exposed in critical exposure 16. Each wafer ultimately undergoes both non-critical exposure 14 and critical exposure 16. This simultaneous exposure aspect further reduces cycle time.

After exposure operation 12, i.e. after each wafer has undergone non-critical portion exposure 14 and critical portion exposure 16, developing takes place at step 18. Conventional developer solutions and conventional techniques and equipment may be used to develop the exposed, patterned wafers at step 18. At metrology step 20, the critical dimensions, CD's may be measured and the overlay with respect to previously formed device features, may be checked.

After metrology step 20, the wafers are ready for further processing. During the further processing which may entail various etching, ion implantation, deposition and diffusion operations, the wafers will again require patterning at a subsequent level and may again be patterned according to the foregoing.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the described component be operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a pattern in a semiconductor device, said method comprising:
   providing a wafer with a layer of resist material thereon;
   forming a pattern in said layer of resist material by:
   exposing a first portion of said pattern using first radiation having a first wavelength, said first wavelength being one of about 365 nm, about 248 nm and about 193 nm; and
   exposing a second portion of said pattern using second radiation having a second wavelength, said second radiation being one of an electron beam and extreme ultraviolet radiation, wherein each of said first and second portions include device features and spacings, said device features and spacings combining to form said pattern, said pattern comprising an integrated circuit.

2. The method as in claim 1, wherein said first radiation is produced by a photolithography tool being one of an i-line exposure system, a 248 nm optical lithography system and a 193 nm optical lithography system; and said second radiation is produced by a lithography tool being one of an electron beam direct writing (EDBW) lithography tool and an extreme ultraviolet (EUV) lithography tool.

3. The method as in claim 1, wherein said exposing a first portion precedes said exposing a second portion.

4. The method as in claim 1, wherein said exposing a first portion follows said exposing a second portion.

5. The method as in claim 4, further comprising:
providing a further wafer with a further layer of resist material thereon, said wafer and said further wafer both part of a production lot of wafers;
forming a further pattern in said further layer of resist material by:
exposing a first portion of said further pattern using said first radiation; then
exposing a second portion of said further pattern using said second radiation,
wherein said exposing a first portion of said further pattern takes place at the same time as said exposing a second portion of said pattern.

6. The method as in claim 1, wherein said first wavelength comprises about 365 nm, said first radiation is produced by an i-line exposure system and said resist material includes a Novolak resin.

7. The method as in claim 1, wherein said first radiation is produced by said 248 nm optical lithography system and said resist material includes a lithographically sensitive material comprising an aromatic material.

8. The method as in claim 7, wherein said aromatic material comprises poly hydroxyl styrene (PHS).

9. The method as in claim 1, wherein said first radiation is produced by a 193 nm optical lithography system and said photoresist material comprises a methacrylate.

10. The method as in claim 1, wherein said first portion comprises input/output features of said pattern and said second portion comprises logic portions of said pattern.

11. The method as in claim 1, wherein said first portion comprises peripheral areas of said pattern and said second portion comprises a central area of said pattern.

12. The method as in claim 1, wherein said resist material is lithographically sensitive to energy having each of said first wavelength and said second wavelength.

13. A method for forming a pattern in a semiconductor device, said method comprising:
providing a wafer with a layer of resist material thereon;
forming a pattern in said layer of resist material by:
exposing a first portion of said pattern using first radiation having a first wavelength, said first wavelength being one of about 365 nm, about 248 nm and about 193 nm; and
exposing a second portion of said pattern using second radiation having a second wavelength, said second radiation being one of an electron beam and extreme ultraviolet radiation, further comprising developing said first portion of said pattern and said second portion of said pattern simultaneously.

14. A method for forming a pattern in a semiconductor device, said method comprising:
providing a wafer with a layer of resist material thereon;
forming a pattern in said layer of resist material by:
exposing a first portion of said pattern using first radiation having a first wavelength, said first wavelength being one of about 365 nm, about 248 nm and about 193 nm; and
exposing a second portion of said pattern using second radiation having a second wavelength, said second radiation being one of an electron beam and extreme ultraviolet radiation, wherein said first portion comprises device features with larger feature sizes and spacings and said second portion comprises device features with smaller device features and spacings including critical dimensions of said pattern.

* * * * *